United States Patent [19]

Savas

[11] Patent Number: 5,102,496

[45] Date of Patent: Apr. 7, 1992

[54] PARTICULATE CONTAMINATION PREVENTION USING LOW POWER PLASMA

[75] Inventor: Stephen E. Savas, Newark, Calif.

[73] Assignee: Applied Materials, Inc., Santa Clara, Calif.

[21] Appl. No.: 732,425

[22] Filed: Jul. 17, 1991

Related U.S. Application Data

[63] Continuation of Ser. No. 412,728, Sep. 26, 1989, abandoned.

[51] Int. Cl.$^5$ .......................... B44C 1/22; B05D 3/06; C23C 14/00; B08B 3/12
[52] U.S. Cl. .................................. 156/643; 134/1; 156/646; 156/345; 204/298.06; 204/298.34; 427/38; 118/50.1; 118/620; 118/728
[58] Field of Search ............... 156/643, 646, 345; 118/728, 50.1, 620; 427/38, 39; 134/1; 204/164, 192.32, 192.1, 192.12, 298.01, 298.06, 298.07, 298.31, 298.33, 298.34

[56] References Cited

U.S. PATENT DOCUMENTS

| | | | |
|---|---|---|---|
| 4,392,938 | 7/1983 | Harra et al. | 204/298.34 |
| 4,718,975 | 1/1988 | Bowling et al. | 156/643 |
| 4,818,359 | 4/1989 | Jones et al. | 204/298.06 |

OTHER PUBLICATIONS

J. W. Coburn et al., "Positive-ion Bombardment of Substrates in rf Diode Glow Discharge Sputtering"; J. Appl. Phys., vol. 43, No. 12, Dec. 1972, p. 4965.

K. Koehler et al.; "Plasma Potentials of 13.56-MHz rf Argon Glow Discharges in a Planar System"; J. Appl. Phys. 57 (1); Jan. 1, 1985, p. 59.

G. S. Selwyn et al.; "In Situ Laser Diagnostic Studies of Plasma-Generated Particulate Contamination"; J. Vac. Sci. Technol. A (4), Jul./Aug. 1989, p. 2758.

*Primary Examiner*—William A. Powell
*Attorney, Agent, or Firm*—John A. Frazzini

[57] ABSTRACT

A method of preventing particulates from depositing onto a wafer during all periods that processing is not taking place including during all periods of wafer transfer into or out of a plasma reactor chamber. During all periods in which a wafer is within the reactor chamber, but is not being processed, a nonreactive auxiliary plasma is produced in the reactor chamber. This plasma charges the particulates and produces just above the surface of the wafer an electric field that repels the particulates from the wafer.

24 Claims, 6 Drawing Sheets

PARTICULATE CONTAMINATION PREVENTION USING LOW POWER PLASMA

This is a continuation of copending application Ser. No. 07/412,728 filed on Sept. 26, 1989, abandoned.

BACKGROUND OF THE INVENTION

This invention relates in general to particulate contamination in integrated circuit (IC) processing and relates more particularly to a plasma reactor design and process that greatly reduces the particulate contamination of wafers during etching of or deposit of thin films on a wafer within such a plasma reactor.

In the figures, the first digit of a reference numeral indicates the first figure in which is presented the element identified by that reference numeral.

Integrated circuit processing technology is continuously concerned with reducing the feature size of circuits to increase the amount of circuitry that can be packed onto an integrated circuit of a given size and to increase the speed of operation by reducing the distance that signals need to travel within such circuits. As feature size has decreased and as circuit complexity has increased, the effect of particulate contamination on process yields has become increasingly important. Particulates of diameter even several times smaller than the feature size of a component can cause failure of the IC if a particle was present at a critical location in the IC during a plasma process step.

Thus, the effect of particulates on yield is particularly critical for the submicron minimum feature size circuits available today because particulates as small as a fraction of a micron can make a circuit inoperable. The numbers of such particles has been found to increase rapidly with decreasing size. This problem is particularly acute for large area ICs such as microprocessors and $\geq 4$ megabit memories because such ICs have an increased area over which a critical defect can occur.

The multilayer structure of typical ICs also increases the effect of particulates on yield. A particulate incorporated into one level of an IC can affect not only the circuitry on that level, but can also affect circuitry on other levels. A defect in an embedded level of an IC can propagate through overlying layers, distorting the topography and thus disrupting operation of those circuit elements. For these reasons it is important to minimize the amount of particulates that come into contact with a wafer immediately before and during processing.

Particulate contamination is important in all phases and types of IC processing and is especially important in processes that utilize a plasma reactor. Plasma reactors can be used in a number of different phases of IC processing. These uses of plasma reactors include plasma etching, reactive ion etching and plasma enhanced chemical vapor deposition. Airborne particulates within a plasma reactor can settle onto a wafer, thereby potentially interfering with subsequently produced IC circuitry.

FIG. 1 illustrates the relative size of some common airborne particulates (see, for example, chapter 7 of the text by Peter Van Zant entitled Microchip Fabrication, published by Semiconductor Services, San Jose, Calif., 1985). Expensive, intricate clean rooms and clean room procedures are utilized to significantly reduce the amount of airborne particulates to which a wafer is exposed during IC fabrication.

Unfortunately, clean rooms cannot prevent airborne particulates from getting into or being produced within a plasma reactor chamber. Even the most careful procedures cannot eliminate all particulates from the reactor chamber before processing begins. Reactant gases, even after filtering, and the wafers themselves can carry additional particulates into the processing chamber. Finally, the plasmas are usually such as to create or cause growth of submicroscopic particles due to their need to selectively etch a given film while not etching others.

In U.S. Pat. No. 4,728,389, entitled Particulate-free Epitaxial Process, issued to Roger E. Logar on Mar. 1, 1988, an epitaxial process is presented that tries to minimize particulates within the processing chamber. Electrostatic attraction is substantially eliminated as a transport mechanism by the selective application of a low level of radiant or conductive thermal energy during cold portions of the epitaxial deposition process.

FIG. 3 illustrates a wafer handling system 30 that allows a robot 31 to supply wafers to any of a plurality of IC processing chambers. This system enables wafers 32 to be exchanged between a wafer cassette elevator 33 and any of the chambers 34–37 without breaking vacuum in these chambers. Robot 31 includes an extensible arm 38 that can extend a wafer blade 38 radially into any of chambers 33–37. Arm 38 is mounted on a rotatable table 310 that enables extensible arm to be directed at any selected one of chambers 33–37. This enables the chambers to be carefully cleaned and purged before wafers are introduced for processing. Even if all particulates could have been purged from chambers 32–35 before processing, the mechanical steps of moving wafers among the chambers and from the wafer cassette elevator 31 to the chambers and back will produce some airborne particulates and the reactants will introduce some particulates. Thus, it would be advantageous to be able to prevent some or all of the airborne particulates within the processing chambers from depositing on the wafers.

SUMMARY OF THE INVENTION

In accordance with the illustrated preferred embodiment, a plasma reactor design is presented that prevents most of the airborne particulates within a plasma reactor chamber from depositing on a wafer within the chamber. A typical existing plasma reactor is illustrated in FIG. 2.

A plasma consists of two qualitatively different regions: the substantially neutral, conductive plasma body and a boundary layer called the plasma sheath. The plasma body consists of substantially equal densities of negative and positive charged particles as well as radicals and stable neutral particles. The plasma sheath is an electron deficient, poorly conductive region in which the electric field strength is large. The plasma sheath forms between the plasma body and any interface such as the walls of the plasma reactor chamber and the rf electrodes. Semiconductor process plasmas are usually produced by a radio frequency (rf) field that couples energy into free electrons within the chamber, imparting sufficient energy to many of these electrons such that ions can be produced through collisions of these electrons with gas molecules. Typically, the walls of the reactor chamber are metal (though often coated with thin insulating layers) so that they function as one of the rf electrodes. The powered rf electrode often also functions as a pedestal on which a wafer is placed for processing. This has the benefit of generating the strongest rf electric field and ion bombardment in the neighborhood of and on the wafer.

Because the electrons are on the order of thousands to hundreds of thousands of times lighter than the plasma ions, they experience an equally greater acceleration than the ions and therefore acquire from the rf field kinetic energies that are somewhat greater than those acquired by the ions. The effect of this is that the energy from the rf field is strongly coupled into electron kinetic energy and only very weakly coupled into ion kinetic energy. As a further result of this large mass difference between the electrons and the ions, collisions between the high energy (also referred to as high temperature) electrons and the ions does not transfer much of the electron energy to the ions. The effect of this is that the electrons acquire a temperature that is typically on the order of 1-5 ev and the other particles in the plasma remain substantially at the temperature of the walls of the plasma reactor chamber or up to a few hundred degrees Centigrade hotter.

Because the electrons are much more mobile than the ions, they initially strike the walls of the reactor chamber at a greater rate than do the ions. The effect of this is that the plasma body becomes slightly electron deficient while the boundary layer sheath becomes substantially electron deficient and thus positively charged at its interface with the electrodes. This net positive charge of the plasma body and boundary layer results in a plasma body electrical potential (usually called the "plasma potential") on the order of several times the electron mean kinetic energy divided by the electron charge. The potential in the bulk of the plasma is nearly constant while the largest part of the potential variation is across the sheath. In an rf plasma, this sheath potential is also dependent on various parameters including the area of the reactor chamber wall, the area of the powered electrode, the pressure in the reactor chamber and the rf power input (see, for example, J. Coburn and E. Kay, J. Appl. Phys., 43, p. 4965 (1972). The resulting time average sheath potential is approximately the sum of its value for a dc plasma, as described above, plus the amplitude of the rf component of the plasma potential.

To date, when a wafer was to be transferred into or out of the reactor chamber, the plasma has always been turned off so that wafer processing does not continue during this transfer interval. This is done because such processing while the wafer is being transferred would almost invariably degrade the circuit structure produced on the wafer. This is particularly true for submicron linewidth features since such small feature size can be produced only by extreme care in every step of the fabrication process. In particular, extensive steps are taken to make processing as uniform as possible over the entire area of the wafer. Such steps often involve making the plasmas substantially symmetric about an axis at which the wafer is centered for processing. Such axial symmetry would not continue if processing were continued as the wafer is transferred into or out of the plasma reactor chamber. Also, in some systems, the wafer is transferred into and out of the reactor chamber by a robot arm which would distort the process plasma if the power were not turned off during wafer transfer.

In accordance with the disclosed invention, it is recognized that, when the plasma is turned off, particulates within the reactor chamber begin to settle onto the wafer (also see the paper by G. S. Selwyn et al entitled In situ laser diagnostic studies of plasma-generated particulate contamination, J. Vac. Sci. Technol. A 7(4), July/August 1989). This occurs immediately after processing, when a wafer is being transferred out of the reactor chamber or when a wafer is being transferred into the reactor chamber and immediately before processing. For the reasons discussed in the Background of the Invention, it is important to avoid letting these particulates settle onto the wafers. When a non-electronegative plasma (e.g., a plasma in which the concentration of negative ions does not greatly exceed that of electrons) is present in the reactor chamber, the high speed free electrons within the plasma quickly charge particulates negative within the plasma body. Because the plasma body is positively charged with respect to surfaces in ac contact with ground, the dc electric field across the plasma sheath between the plasma body and the powered electrode acts to hold these charged particulates away from both the powered electrode and the wafer located on the powered electrode. This dc electric field across the plasma sheath exists at any surface within the chamber, including the wafer surface. When the plasma is turned off, this electric field vanishes, thereby enabling the particulates to settle onto the wafer.

In accordance with the illustrated preferred embodiment, a plasma is maintained within the reactor chamber at all times that a wafer is within the chamber, including those times during which a wafer is being transferred into or out of the chamber. This may either be the active processing plasma or an auxiliary or supplemental plasma of moderate or low power produced either by the power supply for the process plasma or by an independent source. During the intervals of wafer transfer, the plasma density produced by this auxiliary plasma source is typically reduced from the level during the active process to a level just sufficient to prevent the particulates from settling onto the wafer. The gas supply during this period is substantially nonhalogenated in order to avoid both processing and an electronegative character of the plasma. Further, there may be an r.f. component introduced into the plasma potential in order to increase the time averaged sheath potential at the surface of the wafer (see, for example, A. Garscadden and K. G. Emeleus, Proc. Phys. Soc. 79, p. 535 (1962)). This level is typically significantly less than the level that occurs during wafer processing in the plasma reactor and avoids processing of the wafer during the periods of transfer into and out of the reactor chamber. As the density of the plasma decreases, both the charge on the particulates and the strength of the dc electric field at the wafer decrease. Therefore, the force on the particulates, which is the product of these two terms, decreases even faster than either of these terms. Thus, this lower density plasma for particulate protection must have a minimum density of electrons of order or greater than $10^8$ cm$^{-3}$.

During the wafer transfer periods, the plasma is preferably produced by an auxiliary plasma source located away from the wafer pedestal to further minimize processing of the wafer during these periods. Any plasma source can be used, including an auxiliary rf electrode, a hollow cathode or a microwave plasma cavity. The plasma reactor chamber should contain a wafer transfer valve with minimum area to reduce plasma flow into non-processing chambers during the wafer transfer.

DESCRIPTION OF THE PREFERRED EMBODIMENT

Figure 9:
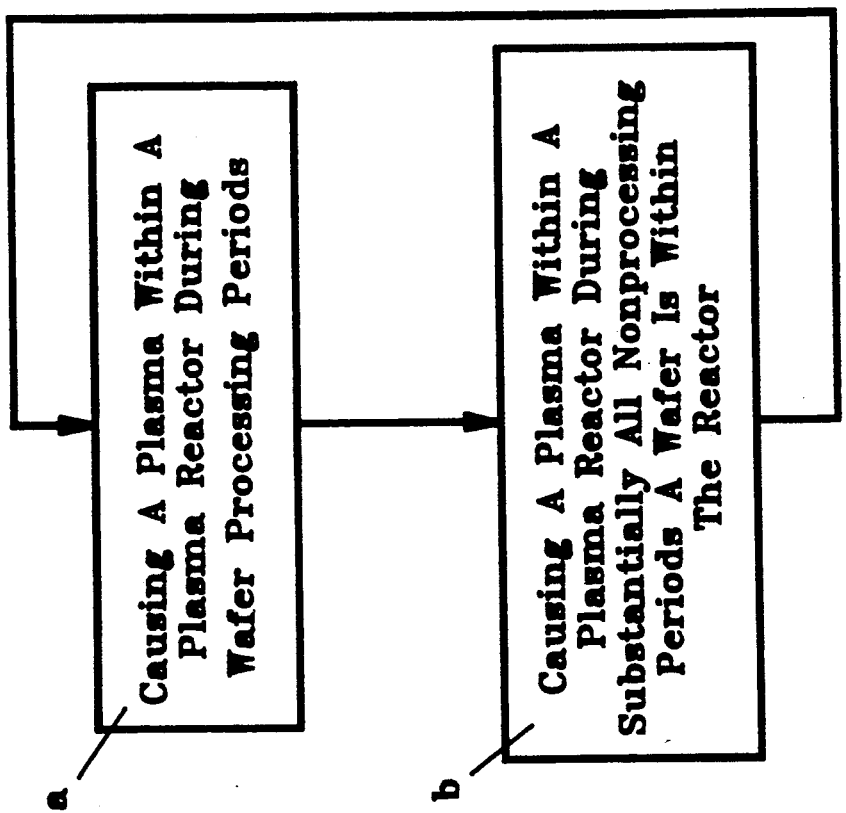
FIG. 9 outlines a method of keeping particulates away from a wafer in a plasma reactor.
Figure 1:
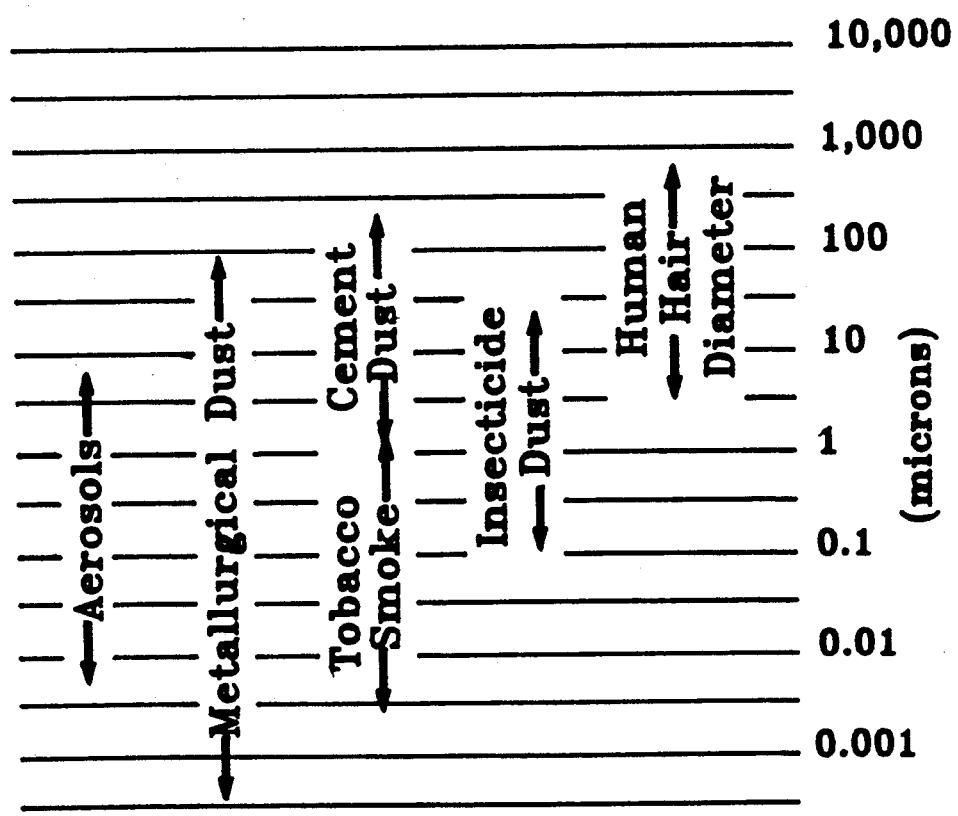
FIG. 1 illustrates the relative size of some common airborne particulates.
Figure 2:
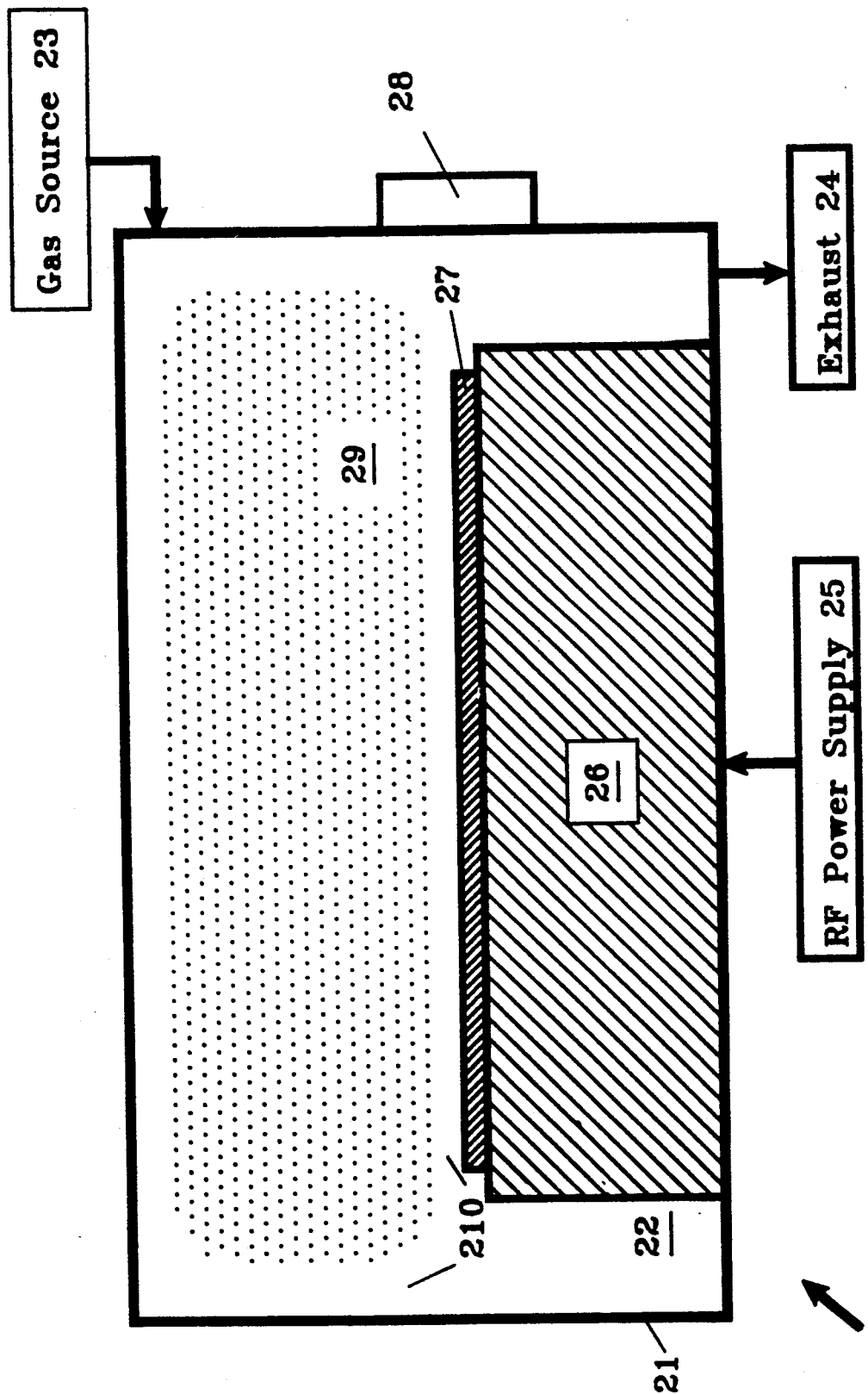
FIG. 2 illustrates a typical plasma reactor.
Figure 3:
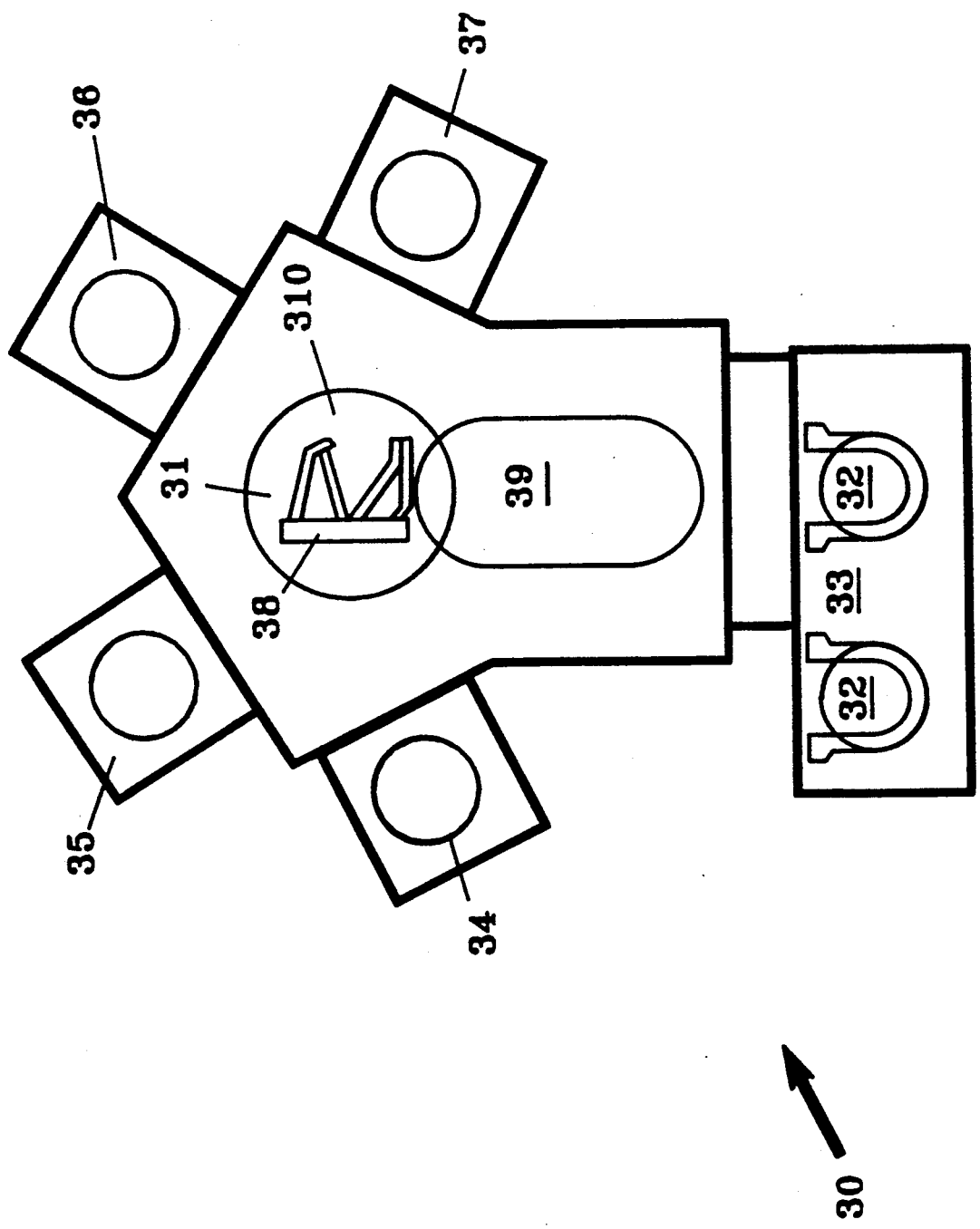
FIG. 3 illustrates a wafer handling system that allows a robot to supply wafers to a plurality of IC processing chambers.

FIG. 9 outlines a method of keeping particulates away from a wafer in a plasma reactor. In accordance with this process, during periods in which a wafer is within the plasma reactor and during which no processing of the wafer is desired, a plasma of reduced intensity is produced to keep particulates away from the wafer while avoiding significant processing of the wafer.

Figure 4:
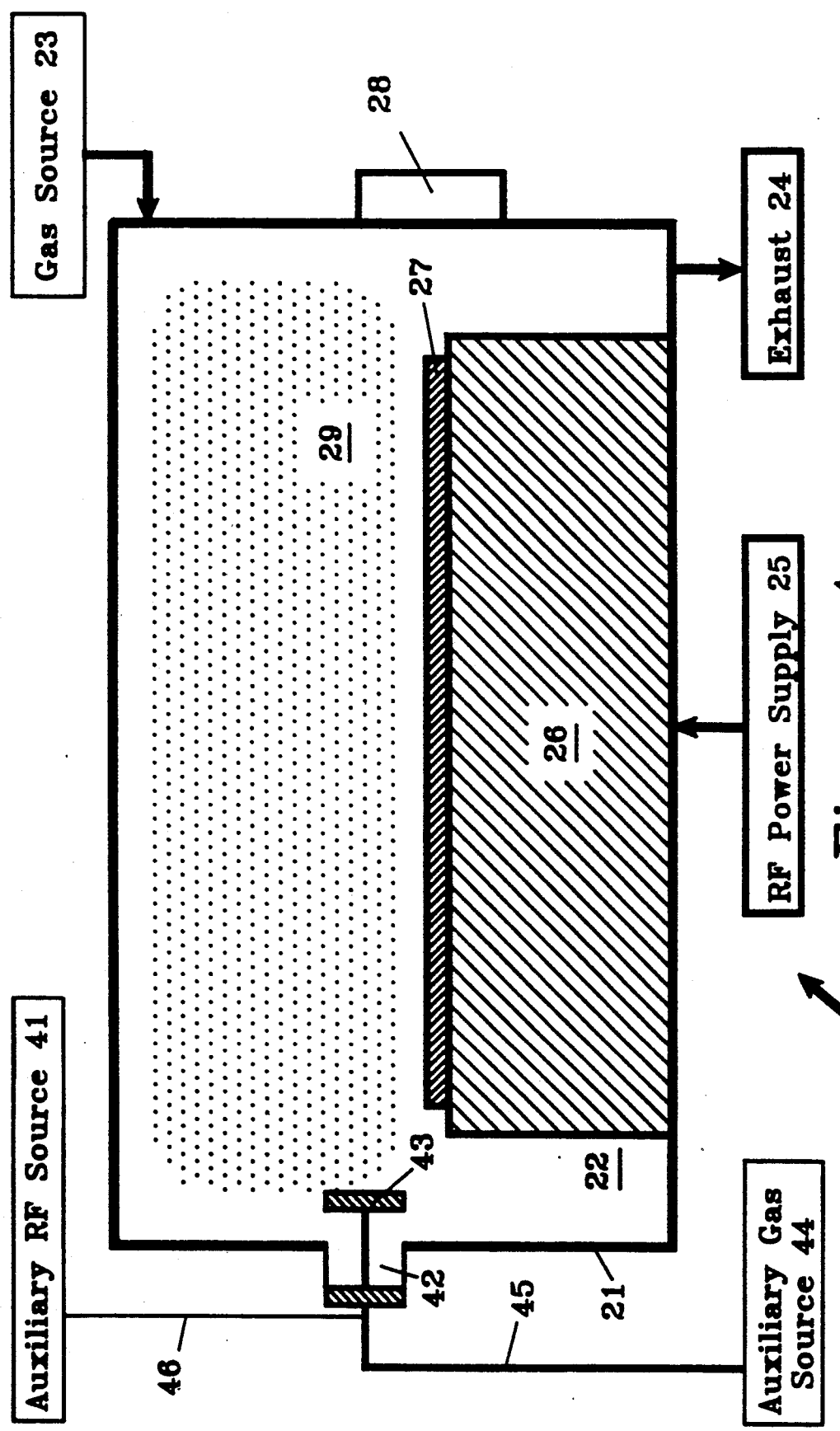
FIG. 4 illustrates a preferred embodiment of the invention utilizing an auxiliary rf plasma source.

FIG. 4 illustrates a conventional plasma reactor 20 to which has been added an auxiliary plasma source, such as auxiliary rf source 41, and an auxiliary gas source 44 to assist use of this reactor to practice the process of FIG. 9. This reactor includes an aluminum wall 21 that encloses a plasma reactor chamber 22. Wall 21 is grounded and functions as one of the plasma electrodes. Gases are supplied to chamber 22 from a gas source 23 and are exhausted by an exhaust system 24 that typically actively pumps gases out of the reactor to maintain a low pressure suitable for a plasma process. An rf power supply 25 provides power to a second (powered) electrode 26 to generate a plasma within chamber 22. Although gas source 23 could provide gases to plasma chamber 22 during the wafer transfer periods, these gases are preferably provided by an auxiliary gas source 44. The gas supply for processing should be symmetrical with respect to the wafer to maintain process symmetry, but the gas supply for the auxiliary plasma should not be symmetrical. Indeed, it is advantageous during wafer transfer periods to direct these auxiliary gases across wafer 27 to sweep particulates away from the wafer surface toward exhaust 24. During the wafer transfer periods, auxiliary gas source 44 provides gasses to chamber 22 through a metallic feed that terminates in a set of holes in an electrode 43. RF power is provided to electrode 43 via a conductor 46 connecting auxiliary rf source 41 to gas feed 45 which is conductively coupled to electrode 43.

Powered electrode 26 also functions as a pedestal on which a wafer 27 is supported during processing within the reactor chamber. This has the advantage of locating the wafer at the location of strongest rf field, thereby enhancing the density of the plasma at the wafer. The wafer is transferred into and out of reactor chamber 22 through a port 28 such as the slit valve presented in U.S. Pat. No. 4,785,962 entitled Vacuum Chamber Slit Valve, issued to Massato Toshima on Nov. 22, 1988. This slit valve has the advantages of effectively sealing chamber 22 during processing and of presenting a minimal area opening through which wafers are transferred into and out of chamber 22. This minimizes leakage of reactor gases through port 28 during wafer transfer into or out of chamber 22.

When power is applied to electrode 26, the resulting rf electric field in the chamber couples energy into free electrons which then ionize halogenated and other gases within the chamber, thereby producing a plasma body 29 surrounded by a plasma sheath 210. In general, the plasma sheath exists between the plasma body and all reactor chamber boundaries adjacent to the plasma body because of the higher mobility of the plasma electrons. When the plasma is first turned on, for a few microseconds, more electrons hit electrode 21 and wafer 27 than do ions such that the plasma becomes positively charged relative to both electrodes. This results in an electric field across the plasma sheath from the plasma body to both electrodes which is directed such as to accelerate positive ions outward from the plasma body and keep negative particles in. The dc component of the voltage of the plasma adjusts until a steady state is reached in which most electrons are repelled at the sheath such that zero dc electric current travels from the plasma's body 29 to ground. Actual values of the voltages can be determined from an equivalent circuit of this electrical structure discussed below.

It is the dc electric field across the plasma sheath near electrode 26 and wafer 27 that enables particulates to be repelled away from the wafer. Particulates in the plasma are continually struck by the positive ions and the negative electrons of the plasma. The particulates are macroscopic particles and therefore absorb most such incident electrons and ions. Because the plasma electrons are so much more mobile than the ions in the plasma, many many times more electrons initially strike an uncharged particulate than do ions. The result is that the particulates become negatively charged until they repel sufficient numbers of electrons that equal numbers of electrons and positive ions collect on them. These particulates are therefore repelled from electrode 26 by the dc component of the electric field at that electrode. The rf component of the electric field is too small to have any significant effect on repelling these particulates away from the wafer. However, the rf field induces an increase in the dc electric field which helps in repelling particulates from surfaces, including the wafer. By maintaining a plasma within the reactor at all times that wafers are in the chamber (including periods of wafer transfer) these particulates are kept away from the wafer.

For a plasma with zero rf component of the potential, the dc voltage $\bar{V}_P$ of the plasma is approximately equal to $$kT_e \ln[\{m_i/2\pi m_e\}^{\frac{1}{2}}]/e$$

where $T_e$ is the temperature of the plasma electrons, $m_i$ is the mass of a typical plasma ion, $m_e$ is the mass of an electron and e is the charge of an electron. For typical masses of plasma ions (i.e., about 40 atomic mass units), this implies that $\bar{V}_P$ is on the order of $5\,kT_e/e$. If there is in addition an rf component of the plasma potential that is produced by an rf powered electrode in the plasma, then the dc value of its potential rises to roughly the sum of the dc value plus the rf amplitude. The level of rf power and gas pressure determine $T_e$.

RF power supply 25 is typically capacitively coupled to powered electrode 26 so that this electrode's dc potential can float relative to grounded wall 21. If the electrode has smaller exposed area than the walls, the electrode floats to a potential nearly as negative as the amplitude of its rf potential (see, for example, the reference by J. Coburn cited above). This reduces sputtering of chamber wall 21 by reducing the sheath potential at the boundary between the plasma body and the chamber wall.

The plasma could be maintained during periods of wafer transfer by continuing to pump rf energy from rf power supply 25 into the plasma through electrode 26. In such a case, the rf power would be reduced during such wafer transfer periods to the minimal level that substantially keeps particulates from settling onto the wafer. This would minimize any processing of the wafer during such transfer periods while preventing particulates from settling onto the wafer. This would, however, still cause the highest energy ions to hit the wafer, as well as the bare electrode.

Unfortunately, the insertion of the wafer handling robot 39 into chamber 22 will disrupt the electric fields near powered electrode 26 producing unwanted variable processing of the wafer or shutting off the plasma above the wafer where it is most needed. Also, movement of the wafer across the fields of powered electrode 26 will also introduce variable processing of the wafer. In order to produce submicron features, it is necessary to take elaborate steps to preserve, to the extent possible, complete process symmetry across the entire wafer. The removal of the wafer while electrode 26 is powered could destroy such uniformity during wafer transfer. It is therefore preferable to decouple power electrode 26 and produce plasma from an alternate source. It is also desirable to use nonreactant gases during transfer so as not to have processing take place during this transfer operation. In the embodiment of FIG. 4, this alternate plasma source consists of auxiliary rf source 41 which couples rf power into auxiliary power electrode assembly 42. In an alternate embodiment, rf source 41 can be omitted and replaced by switchable power from rf power supply 25.

Figure 5:
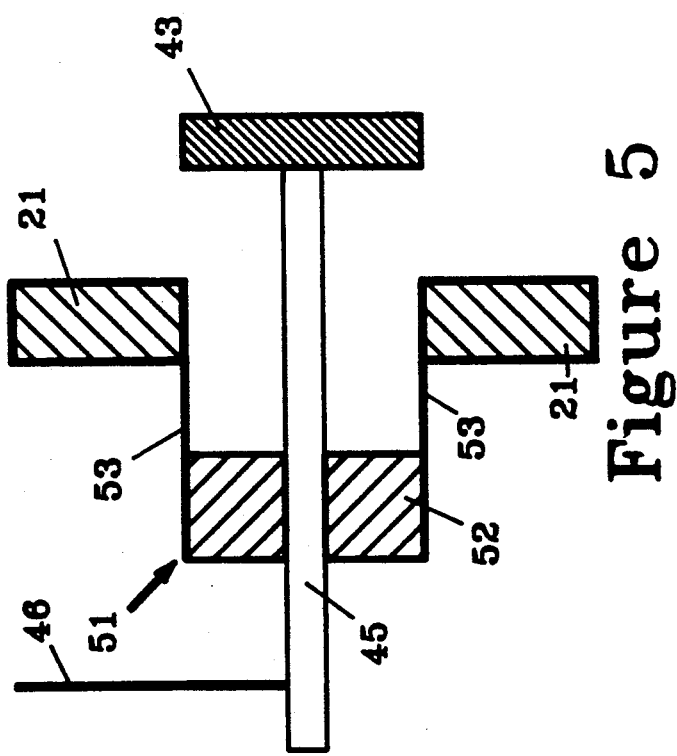
FIG. 5 illustrates in greater detail a simple choice of the auxiliary rf plasma source.

There are many known ways to couple power from an rf source to a powered electrode. A particularly simple embodiment of electrode 43 is presented in FIG. 5. Hollow gas feed 45 enters chamber 22 through an insulating power feed 51 consisting of a ceramic end section 52 and a sidewall 53. This gas feed ejects gas into chamber 22 through holes in electrode 43. The diameter and length of electrode 43 are such that its surface area is less than that of the main electrode and therefore it produces a modest rf component of the plasma potential. This reduces sputtering of the walls and wafer during transfer.

Figure 7:
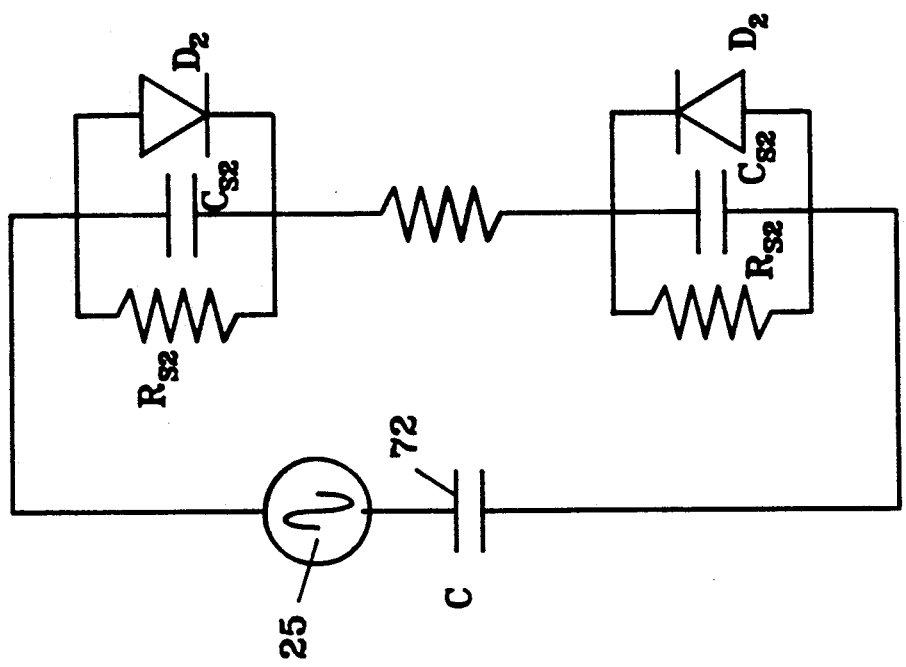
FIG. 7 shows the electrical equivalent circuit of a plasma reactor.

FIG. 7 shows the equivalent circuit of the electrical discharge in the plasma reactor. The positive electric charge in the sheath region between the plasma body and the electrode surfaces is capacitive charge storage that can be modeled as a capacitance $C_{s1}$ between the powered electrode and the plasma body. There is also a capacitance $C_{s2}$ between the walls and the plasma body. The plasma itself is essentially resistive for rf frequencies below the "plasma frequency". The low conductivity of the sheath introduces a high resistive component $R_{s1}$ in parallel with $C_{s1}$ and a high resistive component $R_{s2}$ in parallel with $C_{s2}$. The high conductivity of the plasma means that the plasma functions as a low resistive component $R_P$. The difference in mobility of the electrons and the ions results in some rectification that is modeled via diodes $D_1$ and $D_2$. A blocking capacitor 72 between powered electrode 26 and the power supply enables the dc potential of powered electrode 26 to float. For dc and typical rf frequencies, the effects of diodes $D_1$ and $D_2$, and of resistances $R_{S1}$ and $R_{S2}$ can be ignored. The result is that capacitors C, $C_{S1}$ and $C_{S2}$ function as a capacitive divider. From such analysis, it has been determined that the auxiliary electrode should have a diameter on the order of five centimeters such that with a power input on the order of 100 Watts the resulting plasma, which has an electron density of order $10^9$ cm$^{-3}$, has an rf potential less than 40 volts.

Figure 6:
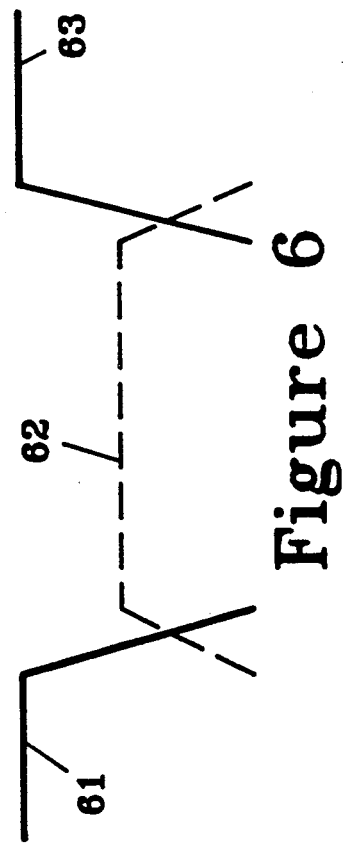
FIG. 6 shows the timing of activation of the primary and secondary plasma sources.

FIG. 6 is a timing diagram that plots as a function of time the power provided by rf sources 25 (shown as solid lines 61 and 63) and 41 (shown as dashed line 62). This diagram illustrates that power is provided at all times while a wafer is in the chamber. This assures that plasma is present in the chamber at all times. The wafer transfer occurs during the interval T when no power is supplied to the main processing electrode 26. It should be noted that the amount of power from rf power source 41 will have a peak value that is usually substantially less than the peak value of power from rf power source 25. The amount of power required from auxiliary rf source 41 is determined by the geometry of the plasma reactor and the maximum size of particulates that are to be electrostatically repelled away from the wafer.

The current and voltage of rf power supply 25 are typically selected to produce a plasma body charge density on the order of $10^9$–$10^{11}$ free electrons per cubic centimeter. The pressure in the reactor chamber is typically on the order of $10^{-2}$–10 Torr. With these choices of parameters, the dc plasma potential is typically on the order of 10–100 volts.

The effect of particulate size on minimum power 62 from the auxiliary plasma source can be seen as follows. Typically particulates have a density on the order of 3 grams per cubic centimeter so that a particulate of diameter on the order of 1 micron weighs on the order of $10^{-14}$ Newtons. If this particulate is charged, with 1000 electrons net charge, then the electric field at powered electrode 26 should exceed $10^{-14}$ Newtons/$1.6 \cdot 10^{-16}$ Coulombs which means a field of 0.60 volts/cm to repel the particulate against gravity. This requires a minimal plasma electron density on the order of $10^8$ to $10^9$ cm$^{-3}$ to cause this degree of charge-up of the particle and therefore requires a minimum auxiliary power on the order of 10–100 Watts, depending on the chamber volume. Typical chamber volumes range from 1 liter to as much as 10's of liters. The magnitude of the electric field at the sheath above the wafer is on the order of 5 $kT_e/e\lambda_D$ where $\lambda_D$ is the Debye length which is equal to $[\epsilon_o kT_e/ne^2]^{\frac{1}{2}}$ and which is less than 1 mm at a density of $10^9$ free electrons per cm$^3$. This field is on the order of 10–100 volts/cm which easily satisfies the field requirements to keep particulates away from the wafer. Conversely, the dc sheath voltage above electrode 26 should be not much more than about 25 volts to avoid significant sputtering of the thin films on the surface of the wafer during the wafer exchange intervals. Therefore, the peak rf power supplied to electrode assembly 42 should be in the range from ten to a few hundred Watts. Since the particulate charge (and hence the electric force) increase linearly with particulate diameter and its weight increases as particulate diameter to the third power, this range of rf power will prevent particulates on the order of several microns or smaller from depositing onto the wafer.

As discussed above, when the particulates become negatively charged, the dc field between the electrodes and the plasma repels these negatively charged particulates away from the wafer. It was also indicated that this negative charge on the particulates arises because the electrons are so much more mobile than are the plasma ions. Implicitly, this assumes that the plasma contains a sufficient number of electrons that indeed the particulates become negatively charged. This will usually be the case, but there are some reactant gases that are sufficiently electronegative that this will not be the case at modest power levels. When such gases are used in processing, then, during the wafer exchange intervals, the processing gases should be purged from the plasma reactor chamber as quickly as possible and replaced with a nonhalogenated gas such that the particulates become negatively charged during the wafer exchange intervals. After the wafer exchange interval, these wafer transfer reactants are purged from the chamber and replaced by suitable process reactants.

Typical process gases include $CHF_3$, $CF_4$, $SF_6$, HBr, HCl, $Cl_2$, $BCl_3$, $CF_2Cl_2$, $SiF_4$, $O_2$, Ar, and He. Of these, $O_2$, Ar, He and $CF_4$ have a sufficiently low electronegativity that particulates become strongly negatively charged in low power plasmas containing these reactants. Other useful choices are He, $N_2$ and $CO_2$. These examples are not exhaustive, but instead are illustrative of suitable reactant gases for the wafer exchange intervals.

Figure 8:
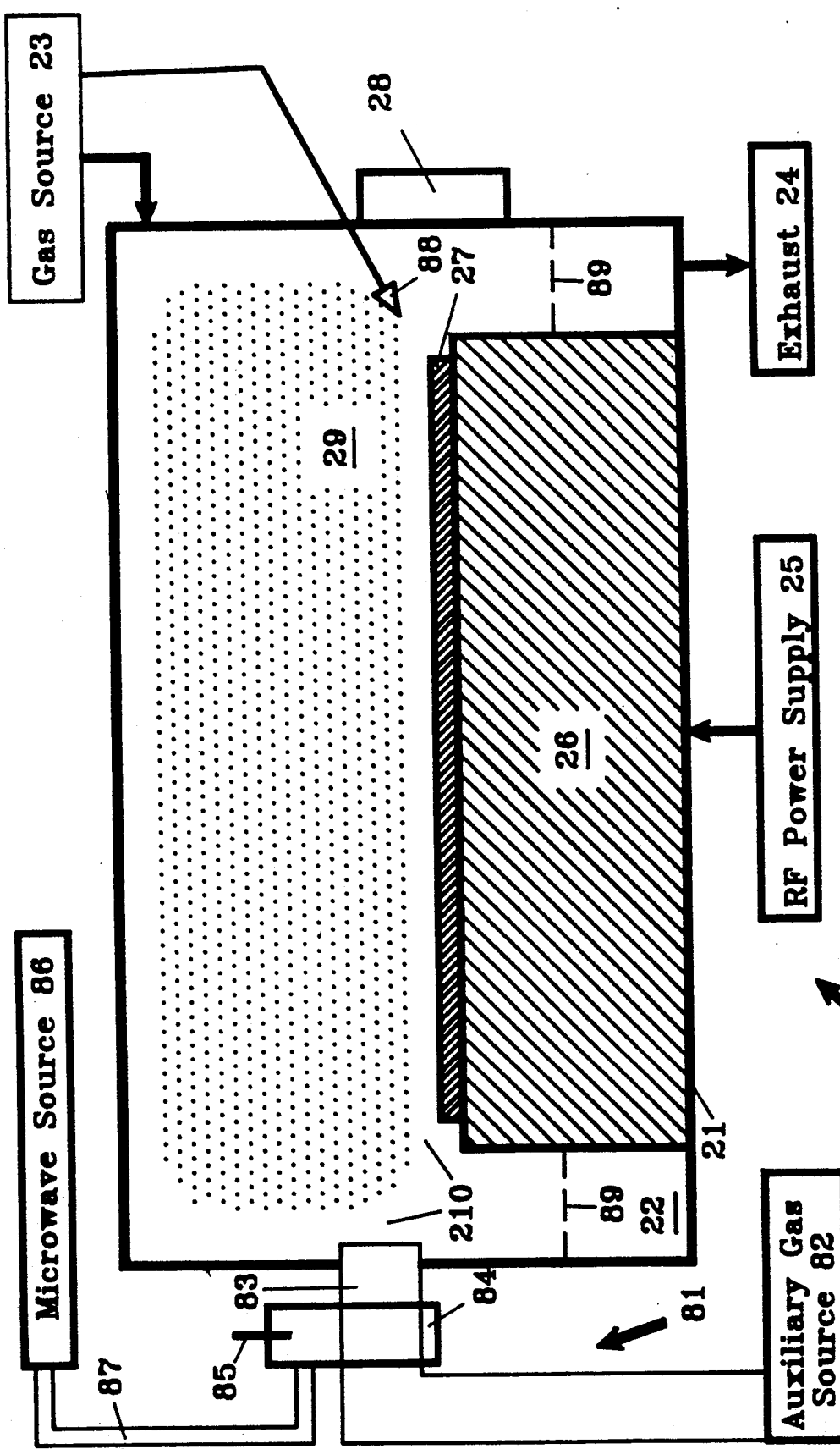
FIG. 8 illustrates an alternate embodiment of the invention utilizing a microwave plasma source as the auxiliary plasma source.

FIG. 8 illustrates an alternate embodiment in which the auxiliary plasma source is a microwave plasma source 81. This microwaave plasma source consists of a gas source 82 that supplies reactant gases into chamber 22 through a tube 83 such as a quartz tube. This tube passes through a microwave cavity 84 which is tuned by means of a tuning stub 85. Microwave power is provided from a microwave source 86 to cavity 84 through a coaxial cable 87. The amount of microwave power should be sufficient to produce a plasma such that the sheath at electrode 26 has an electric field sufficiently strong to repel the particulates. The power requirements are substantially the same as for an rf generated plasma.

In order to prevent particulates from depositing on a wafer, it is advantageous not only to repel the particulates vertically away from the surface of the wafer, but in addition to draw these particulates laterally away from the wafer. One such method consists of tilting the wafer away from being horizontal. For example, if the wafer is tilted by 15°, then the combination of a vertical gravitational force on the particulates and an electrical repulsion normal to the surface of the wafer will produce a lateral force that will carry the particulates laterally away from the wafer. Alternatively, a gas nozzle, such as nozzle 88 can be included to provide a lateral flow of gas across the wafer. Preferably, this flow is toward the exhaust 24 so that these particulates are removed from chamber 22. Above the exhaust manifold to exhaust system 24 are screens 89 that prevent the plasma from extending too far into the exhause ports. However, the resulting electric field at these screens can be large enough to prevent these particulates from getting past these screens. To enable them to pass these screens, the hole in the screen should be sufficiently large that the resulting electric field at these holes is low enough that the weight of these particulates and the flow of air through the screen will draw these particulates past these screens. A hole size in the screen on the order of several to ten millimeters is sufficent to let most of these particulates pass through these screens.

I claim:

1. A method of repelling particulates from a wafer within a plasma reactor chamber comprising the steps of:
   (a) during one or more wafer processing periods, causing there to be a gas plasma within the reactor chamber; and
   (b) during one or more periods in which a wafer is within the chamber and in which substantially no processing of the wafer is to occur, causing there to be a lower power, substantially nonprocessing gas plasma within the reactor, whereby particulates in the reactor chamber will acquire a net charge and thus can be repelled away from the wafer within the reactor chamber.

2. A method as in claim 1 wherein step (b) comprises exciting the plasma with an electrical power level high enough to produce sufficient electron and ion charge densities within the reactor chamber such that an electric field is generated in a plasma sheath just above the wafer sufficient to repel charged particulates away from the wafer.

3. A method as in claim 2 wherein said dc electric field at the wafer is at least 1.0 Volts/cm.

4. A method as in claim 1 wherein step (b) comprises generating plasma from an auxiliary plasma source located away from the wafer, whereby plasma processing of the wafer is minimized.

5. A method as in claim 4 wherein step (b) comprises generating plasma from an auxiliary rf powered electrode in the reactor chamber.

6. A method as in claim 4 wherein step (b) comprises generating a plasma in a microwave plasma generator coupled to supply this plasma to the reactor chamber.

7. A method as in claim 1 wherein step (b) further comprises the steps of (i) removing from the chamber some of the gas present during step (a), and (ii) introducing another less-reactive gas into the chamber.

8. A method as in claim 1 wherein, during periods of wafer transfer, wafers are transferred between the reactor chamber and the exterior of the reactor chamber through a narrow wafer transfer valve, whereby the amount of plasma flowing out of the chamber during such transfer is minimized.

9. A method as in claim 1 wherein step (b) further comprises the step of replacing a substantial portion of the reactant gases within the reactor chamber with gases that are non-halogenated and sufficiently electropositive that enough free electrons are generated in the plasma that particulates become negatively charged by the plasma during periods of wafer transfer.

10. A method as in claim 1 further wherein step (b) further comprises the step of tilting the wafer to an angle away from horizontal so that gravity and electromagnetic repulsion of particulates produces a net force that causes the particulates to drift across and then off the wafer, above the sheath.

11. A method as in claim 10 wherein step (b) further comprises the step of removing particulates that have drifted across the wafer from the reactor chamber.

12. A method as in claim 1 wherein step (b) further comprises the step of flowing gas across the wafer during periods of wafer transfer to carry particulates laterally across and then away from the wafer.

13. A method as in claim 12 wherein step (b) further comprises the step of removing particulates that have drifted across the wafer from the reactor chamber through holes in a plasma confining screen.

14. A plasma reactor comprising:
a chamber;
means for generating a plasma suitable for processing a wafer within said chamber; and
means for generating a substantially nonprocessing plasma within said chamber during one or more periods in which no processing of said wafer is desired, thereby enabling a nonprocessing plasma to be produced in said chamber to repell particulates from a wafer within said chamber during said periods.

15. A reactor as in claim 14, wherein said means for generating a substantially nonprocessing plasma comprises an auxiliary electrode connected to an electrical power source, said auxiliary electrode being positioned within the chamber away from the wafer.

16. A reactor as in claim 14, wherein said means for generating a substantially nonprocessing plasma comprises a microwave plasma source.

17. A reactor as in claim 14 further comprising:
means for directing a flow of gas across said wafer so as to sweep particulates away from said wafer.

18. A reactor as in claim 17 wherein said means for directing a flow of gas across said wafer comprises a nozzle connected to a gas source.

19. A reactor as in claim 17 wherein said means for directing a flow of gas across said wafer comprises a microwave plasma source.

20. A reactor as in claim 14 further comprising
means for replacing a substantial portion of wafer processing gases during nonprocessing periods with a less reactive gas capable of maintaining a low level plasma sufficient to produce repulsion of particulates away from said wafer.

21. A reactor as in claim 20 wherein said less reactive gas is nonhalogenated and sufficiently electropositive that particulates within the reactor chamber become negatively charged.

22. A reactor as in claim 14 further comprising means for exhausting gas from the chamber through an exhaust port, wherein said exhaust port encloses one or more electrically conductive screens which prevent the plasma from extending past the screens, said screens have openings large enough for particulates to pass through, whereby particulates are removed from the chamber along with the exhausted gas.

23. A reactor as in claim 14, wherein said means for generating a substantially nonprocessing plasma includes an electrical power source for supplying electrical power to a gas within the chamber, said power being at a level low enough to substantially avoid processing of the wafer, but high enough to create a plasma sheath above the wafer having an electric field strength sufficient to repel charged particulates away from the wafer.

24. a reactor as in claim 14, further comprising a wafer support member for supporting a wafer within the chaber at an orientation other than horizontal, whereby the number of particles settling on the wafer may be reduced.

* * * * *